US012635359B2

(12) United States Patent
Wu et al.

(10) Patent No.: US 12,635,359 B2
(45) Date of Patent: May 19, 2026

(54) ARRAY SUBSTRATE AND DISPLAY PANEL

(71) Applicants: CHANGSHA HKC OPTOELECTRONICS CO., LTD., Changsha (CN); HKC CORPORATION LIMITED, Shenzhen (CN)

(72) Inventors: Kerong Wu, Changsha (CN); Chung Jae Moon, Changsha (CN); Baohong Kang, Changsha (CN)

(73) Assignees: CHANGSHA HKC OPTOELECTRONICS CO., LTD., Changsha (CN); HKC CORPORATION LIMITED, Shenzhen (CN)

( * ) Notice: Subject to any disclaimer, the term of this patent is extended or adjusted under 35 U.S.C. 154(b) by 595 days.

(21) Appl. No.: 18/067,494

(22) Filed: Dec. 16, 2022

(65) Prior Publication Data

US 2023/0123248 A1 Apr. 20, 2023

Related U.S. Application Data

(63) Continuation of application No. PCT/CN2021/143228, filed on Dec. 30, 2021.

(30) Foreign Application Priority Data

May 14, 2021 (CN) .......................... 202110533073.7

(51) Int. Cl.
$H10K\ 59/124$ (2023.01)
$H10K\ 59/122$ (2023.01)
(Continued)

(52) U.S. Cl.
CPC ......... *H10K 59/124* (2023.02); *H10K 59/122* (2023.02); *H10K 59/80522* (2023.02); *H10D 30/6723* (2025.01); *H10K 2102/301* (2023.02)

(58) Field of Classification Search
None
See application file for complete search history.

(56) References Cited

U.S. PATENT DOCUMENTS

| | | | | |
|---|---|---|---|---|
| 9,018,621 | B2 * | 4/2015 | Park | H10K 59/80522 438/82 |
| 9,748,512 | B2 * | 8/2017 | Kim | H10K 59/121 |
| 10,854,693 | B2 * | 12/2020 | Shim | H10K 59/122 |

(Continued)

FOREIGN PATENT DOCUMENTS

| | | |
|---|---|---|
| CN | 103066212 A | 4/2013 |
| CN | 104681588 A | 6/2015 |

(Continued)

OTHER PUBLICATIONS

First Office Action issued in counterpart Chinese Patent Application No. 202110533073.7, dated Apr. 13, 2022.

(Continued)

*Primary Examiner* — Long Pham
(74) *Attorney, Agent, or Firm* — Westbridge IP LLC

(57) ABSTRACT

Disclosed are an array substrate and a display panel. The array substrate includes a TFT device layer; a pixel definition layer arranged in a non-via area of a non-opening area of the TFT device layer, the non-opening area including a via area and the non-via area; a barrier wall arranged at the via area and in an inverted trapezoid shape; an organic light emitting diode layer arranged on an upper end of the barrier wall and an upper end of part of auxiliary electrodes in the via area; and a cathode arranged on the upper end of the part of the auxiliary electrodes in the via area. This application may alleviate the uneven distribution of cathode voltage to improve the brightness uniformity of the display panel.

18 Claims, 3 Drawing Sheets

(51) Int. Cl.

| | |
|---|---|
| *H10K 59/80* | (2023.01) |
| *H10D 30/67* | (2025.01) |
| *H10K 102/00* | (2023.01) |

(56) References Cited

U.S. PATENT DOCUMENTS

| | | | | |
|---|---|---|---|---|
| 2012/0205647 | A1 | 8/2012 | Heo | |
| 2014/0183479 | A1* | 7/2014 | Park | H10K 59/1315 438/34 |
| 2014/0312323 | A1* | 10/2014 | Park | H10K 59/80516 438/23 |
| 2016/0149156 | A1* | 5/2016 | Kim | H10K 59/121 438/46 |
| 2016/0233278 | A1 | 8/2016 | Yoon et al. | |
| 2017/0033166 | A1* | 2/2017 | Shim | H10K 59/1201 |
| 2019/0326370 | A1 | 10/2019 | Lu | |

FOREIGN PATENT DOCUMENTS

| | | | |
|---|---|---|---|
| CN | 104885251 | A | 9/2015 |
| CN | 104885252 | A | 9/2015 |
| CN | 105633297 | A | 6/2016 |
| CN | 109360900 | A | 2/2019 |
| CN | 109599502 | A | 4/2019 |
| CN | 110010657 | A | 7/2019 |
| CN | 113270426 | A | 8/2021 |
| JP | 2009032673 | A | 2/2009 |

OTHER PUBLICATIONS

International Search Report and Written Opinion issued in corresponding PCT Application No. PCT/CN2021/143228, dated Mar, 4, 2022.

* cited by examiner

ARRAY SUBSTRATE AND DISPLAY PANEL

CROSS-REFERENCE TO RELATED APPLICATIONS

This application is a continuation application of International Application PCT/CN2021/143228, filed on Dec. 30, 2021, which claims priority to Chinese Patent Application No. 202110533073.7, filed on May 14, 2021, the entire contents of which are incorporated herein by reference in their entireties.

TECHNICAL FIELD

This application relates to the technical field of display screens, and in particular to an array substrate and a display panel.

BACKGROUND

For the top-emitting array substrate, the cathode is thin, which will cause the increase of cathode resistance and in turn the uneven distribution of cathode voltage, resulting in low brightness uniformity of the display panel.

The above content is used to assist in understanding the present application, and it does not mean that the above content is recognized as prior art.

SUMMARY

A main object of this application is to provide an array substrate and a display panel, aiming at solving the technical problem of low brightness uniformity of the display panel in the related art.

To achieve the above object, an array substrate is provided in this application, including:

a thin film transistor (TFT) device layer;

a pixel definition layer arranged in a non-via area of a non-opening area of the TFT device layer, in particular the non-opening area includes a via area and the non-via area;

a barrier wall arranged at the via area, in particular the barrier wall is in an inverted trapezoid shape;

an organic light emitting diode layer arranged on an upper end of the barrier wall and an upper end of part of auxiliary electrodes in the via area; and a cathode arranged on the upper end of the part of the auxiliary electrode in the via area.

In order to achieve the above object, a display panel is also provided in this application, including an array substrate according to above each embodiment.

The array substrate provided by this application includes a TFT device layer; a pixel definition layer arranged in a non-via area of a non-opening area of the TFT device layer, in particular the non-opening area includes a via area and the non-via area; a barrier wall arranged at the via area, in particular the barrier wall is in an inverted trapezoid shape; an organic light emitting diode layer arranged on an upper end of the barrier wall and an upper end of part of an auxiliary electrode in the via area; and a cathode arranged on the upper end of part of the auxiliary electrode in the via area.

The array substrate provided by this application uses the inverted trapezoidal barrier wall, thus when the organic light emitting diode layer is evaporated, a gap that makes the cathode contact with the auxiliary electrode will be left on both sides of the bottom of the barrier wall, so that the uneven distribution of cathode voltage may be alleviated.

BRIEF DESCRIPTION OF THE DRAWINGS

In order to more clearly explain the embodiments of this application or the technical solutions in the related art, the drawings that need to be used in the description of the embodiments or the related art will be briefly introduced below. Obviously, the drawings in the following description are only some embodiments of this application. Other drawings may be obtained for those of ordinary skill in the art according to the structures shown in these drawings without any inventive step.

Figure 1:
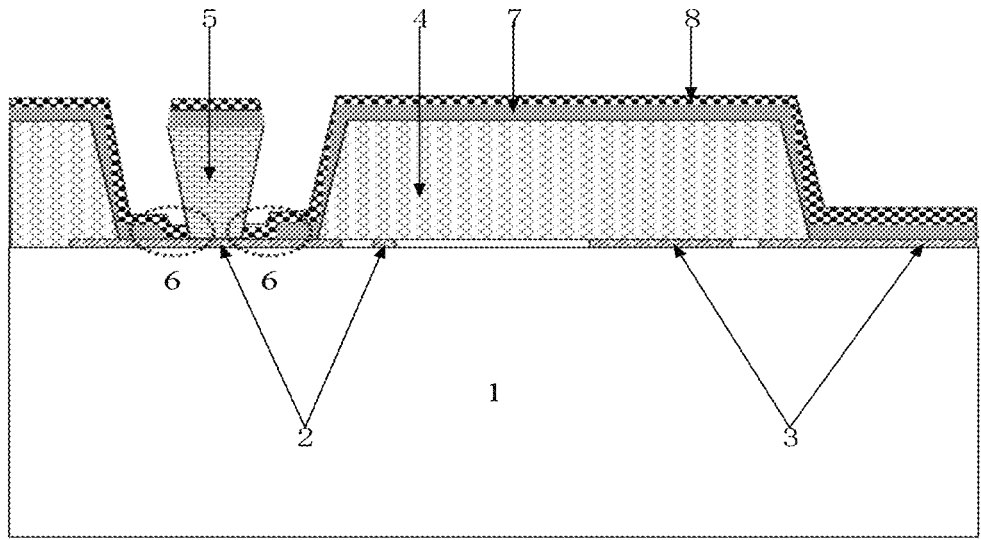
FIG. 1 is a schematic diagram of a hardware structure of an array substrate according to an embodiment of this application.

The achievement of object, functional characteristics and advantages of this application will be further explained with reference to the drawings in combination with the embodiments.

DETAILED DESCRIPTION OF THE EMBODIMENTS

The technical solutions in the embodiments of this application will be clearly and completely described below with reference to the drawings in the embodiments of this application. Obviously, the described embodiments are only part of the embodiments of this application, rather than all the embodiments. Based on the embodiments in this application, all other embodiments obtained by those of ordinary skill in the art without inventive step are within the protection scope of this application.

It should be noted that all directional indications, such as up, down, left, right, front and back, in the embodiments of this application are only used to explain the relative positional relationship, movement situation or the like among various components in a certain posture as shown in the drawings. If the specific posture changes, the directional indications will also change accordingly.

In addition, the descriptions such as "first" and "second" in this application are only used for descriptive purposes, and should not be understood as indicating or implying their relative importance or implicitly indicating the number of indicated technical features. Therefore, the features defined with "first" and "second" may comprise at least one of these features explicitly or implicitly. In addition, the technical solutions of various embodiments may be combined with each other, but which should be based on the implementation for those of ordinary skill in the art. When the combination of technical solutions is contradictory or cannot be implemented, it should be considered that such combination of technical solutions neither exists nor falls within the protection scope of this application.

Pixels of the organic light emitting diode (OLED) TFT device layer may be divided into bottom emitting and top emitting. In the past, the pixel design of the array substrate mostly adopted the bottom emitting design, in which the anode was a transparent electrode and the cathode was aluminum being used as a reflective layer of the organic light emitting diodes, and the light could only be emitted through the TFT array and the glass TFT device layer. Since the light emitting area is related to the number and area of thin film transistors (TFTs) and the capacitors in pixels, the light emitted by OLED will be blocked by opaque metal wires in the TFTs and the capacitors, so the opening ratio may only reach about 40% at the maximum. The top emitting OLED design uses transparent or semi-transparent cathode, while the anode is an opaque metal. Therefore, even the TFTs and the capacitors take up most of area in the pixels, the luminous area of the OLED is not affected by the area of TFTs and the capacitors in the pixels because the OLED emits light upwards. However, in order to maintain transparency, the metal of the cathode for the top emitting needs to be very thin, and its sheet resistance cannot be reduced, which in turn causes the uneven distribution of the cathode voltage, resulting in low brightness uniformity of the display panel.

The array substrate provided by this application includes:

a TFT device layer;

a pixel definition layer arranged in a non-via area of a non-opening area of the TFT device layer, the non-opening area including a via area and the non-via area;

a barrier wall arranged at the via area and in an inverted trapezoid shape;

an organic light emitting diode layer arranged on an upper end of the barrier wall and an upper end of part of auxiliary electrodes in the via area; and a cathode arranged on the upper end of part of the auxiliary electrodes in the via area.

The array substrate provided by this application uses the inverted trapezoidal barrier wall, thus when the organic light emitting diode layer is evaporated, a gap that makes the cathode contact with the auxiliary electrodes will be left on both sides of the bottom of the barrier wall, so that the uneven distribution of the cathode voltage may be alleviated.

As shown in FIG. 1, FIG. 1 is a schematic diagram of the hardware structure of an array substrate according to an embodiment of this application. The array substrate includes:

a TFT device layer 1;

a pixel definition layer 4 arranged in a non-via area of a non-opening area of the TFT device layer 1, the non-opening area including a via area and the non-via area;

a barrier wall 5 arranged at the via area and in an inverted trapezoid shape;

an organic light emitting diode layer 7 arranged on an upper end of the barrier wall and an upper end of part of auxiliary electrodes 2 in the via area; and a cathode 8 arranged on the upper end of part of the auxiliary electrodes 2 in the via area.

Figure 3:
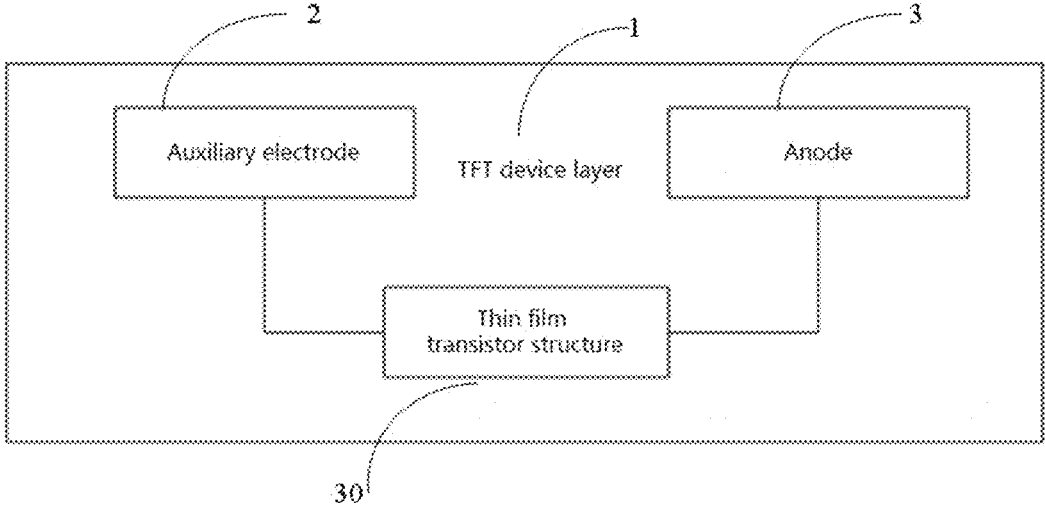
FIG. 3 is a schematic diagram of a module structure of a TFT device layer according to this application.
Figure 4:
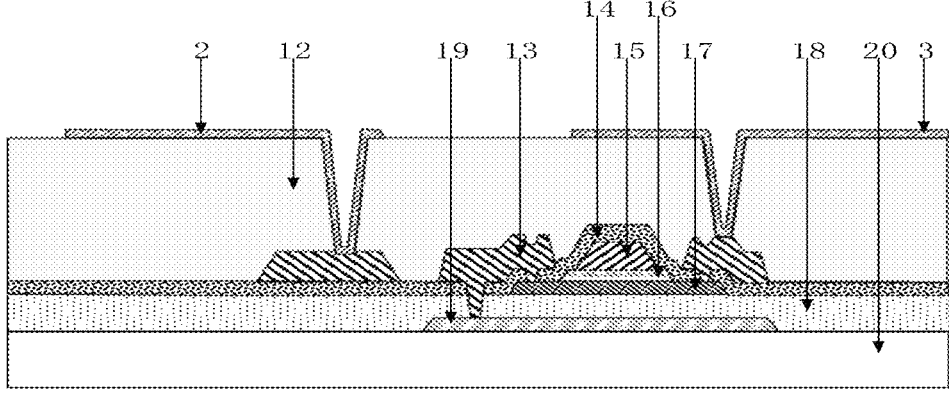
FIG. 4 is a schematic diagram of a hardware structure of the TFT device layer according to this application.

In this embodiment, the array substrate includes a TFT device layer 1, and the TFT device layer 1 includes an auxiliary electrode 2, an anode 3, and a thin film transistor structure 30. In an embodiment, the module architecture of the TFT device layer 1 is shown in FIG. 3, and further, the hardware architecture of the TFT device layer 1 is shown in FIG. 4. The thin film transistor structure 30 is composed of a planarization layer (OC) 12, a source/drain (SD) 13, an insulation layer (ILD) 14, a gate 15, a gate insulation layer (GI) 16, an active layer (ACT) 17, a buffer layer 18, a bottom shield metal (light shield layer) 19 and an substrate 20.

Figure 5:
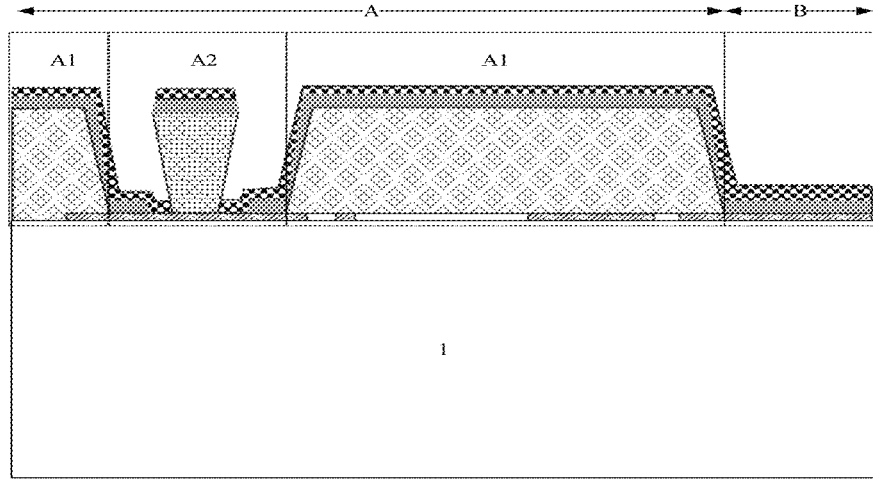
FIG. 5 is an area division diagram of the TFT device layer according to this application.

Optionally, the TFT device layer 1 is prepared by a thin film transistor process and a positive electrode process. In an embodiment. As shown in FIG. 5, the upper end of the TFT device layer 1 may be divided into an opening area (B) and a non-opening area (A). The non-opening area includes a via area (A2) and a non-via area (A1), and the opening area is also called a light emitting area. The organic light emitting diode layer 7 and the cathode 8 are sequentially evaporated on the anode 3 in the light emitting area, so the light emitting area may emit the light successfully. An area division of the upper end of the TFT device layer 1 is shown in FIG. 5.

Furthermore, the pixel definition layer 4 is arranged in a non-via area of a non-opening area of the TFT device layer 1, and the non-opening area includes a via area and the non-via area. The via area is provided with a barrier wall 5 in a middle, and an upper end of the barrier wall 5 is sequentially provided with an organic light emitting diode layer 7 and a cathode 8. The barrier wall 5 is in an inverted trapezoid shape. It is easy to understand that when there is an inverted trapezoid barrier wall 5, after the organic light emitting diode layer 7 is vertically evaporated, both sides of the bottom of the barrier wall 5 will not be evaporated with the organic light emitting diode layer 7, but will form a gap 6. It is easy to understand that after the evaporation process of the organic light emitting diode layer 7 is completed, the pixel definition layer 4 and the anode of the light emitting area are also deposited with the pixel definition layer 7. Further, when to evaporate to form the cathode 8 at a preset angle $\theta$, the cathode 8 may be successfully deposited in the gap 6 where the organic light emitting diode layer 7 is not deposited, thus achieving the contact between the cathode 8 and the auxiliary electrode 2 below the gap 6. For example, taking the TFT device layer 1 as a plane and evaporating to form the cathode at the preset angle $\theta$ downward, the cathode 8 may enter the gap 6 more easily, thus contacting the auxiliary electrode 2 below the gap 6. In an embodiment, the thicknesses of the deposited organic light emitting diode layer 7 and the cathode 8 are not limited here, but may be preset according to specific conditions. Preferably, the preset angle $\theta$ is preferably 30 to 89 degrees ($30°$-$89°$).

In the technical solution of this embodiment, the array substrate uses the inverted trapezoidal barrier wall, thus when the organic light emitting diode layer is evaporated, the gap 6 that makes the cathode contact with the auxiliary electrode will be reserved, so that the uneven distribution of cathode voltage may be alleviated.

Figure 2:
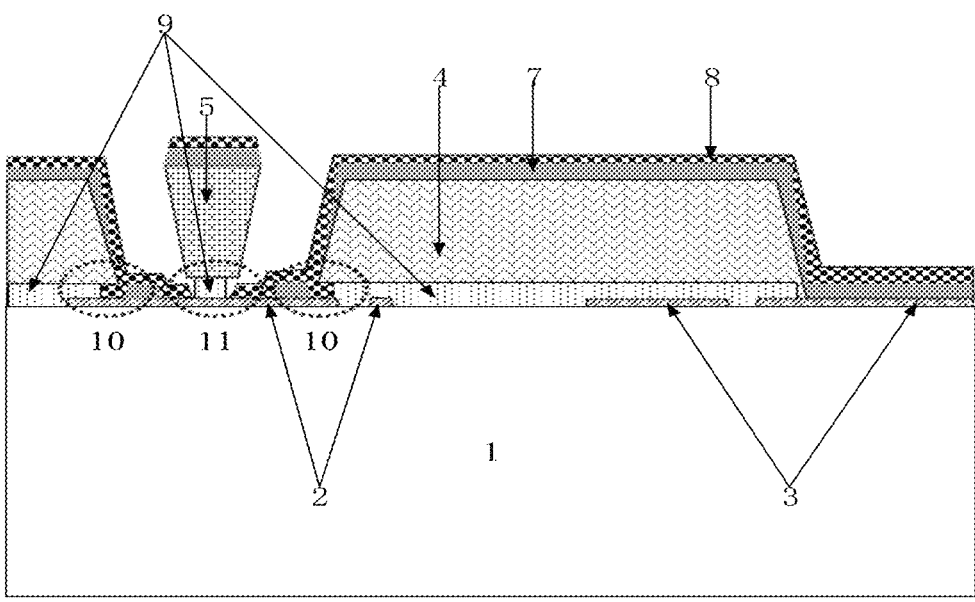
FIG. 2 is a schematic diagram of the hardware structure of the array substrate according to another embodiment of this application.

Optionally, refer to FIG. 2, which is a schematic diagram of the hardware structure of the array substrate according to an embodiment of this application, the array substrate further includes an inorganic thin film 9. The inorganic thin film 9 is arranged below the pixel definition layer 4 and the barrier wall 5 and includes a silicon dioxide thin film or a silicon nitride thin film.

In this embodiment, the array substrate further includes an inorganic thin film 9. The inorganic thin film 9 is arranged below the pixel definition layer 4 and the barrier wall 5, and then the inorganic thin film 9 is side-etched, so that a first side etching space 10 and a second side etching space 11 are formed among both sides of the bottom of the pixel definition layer 4, both sides of the bottom of the barrier wall 5 and edges of the inorganic thin film 9. Widths of the first side etching space 10 and the second side etching space 11 are preferably 1 to 3 nanometers. Preferably, the side etching process may be a wet etching process. Preferably, the inorganic thin film 9 is a silicon dioxide thin film or a silicon nitride thin film. Preferably, the thickness of the inorganic thin film 9 is preferably between 500 and 3000 angstroms.

In the technical solution of this embodiment, since the first side etching space 10 and the second side etching space 11 are added, the cathode 8 may be brought into contact with the auxiliary electrode 2 in the first side etching space 10 and the second side etching space 11, which in turn causes the contact area between the cathode 8 and the auxiliary electrode 2 to be larger, and further alleviate the uneven distribution of cathode voltage.

The above embodiments are only preferred embodiments of this application, which do not limit the protection scope of this application. All equivalent structural changes made by using the contents of the description and drawings of this application, or any direct/indirect application in other related technical fields under the concept of this application are included in the patent protection scope of this application.

In order to achieve the above purpose, this application also provides a display panel, which includes the above-mentioned array substrate. As this display panel adopts all the technical solutions of all the above-mentioned embodiments, it has at least all the beneficial effects brought by the technical solutions of the above-mentioned embodiments, which will not be repeated here.

It should be understood for those skilled in the art that the embodiments of this application may be provided as methods or systems. Therefore, this application may take the form of embodiments with only hardware, embodiments with only software, or embodiments combining software and hardware.

It should be noted that in the claims, any reference signs in parentheses shall not be construed as limiting the claims. The wordings "comprise", "comprising", "include", "including" or the like do not exclude the presence of components or steps not listed in the claims. The wording "a" or "an" preceding a component does not exclude the presence of a plurality of such components. This application may be implemented by means of hardware including several different components and by means of a suitably programmed computer. In a unit claim enumerating several devices, several of these devices may be embodied by the same item of hardware. The use of the wordings, such as first, second, third, and the like does not indicate any order. These wordings may be interpreted as names.

Although the preferred embodiments of this application have been described, those skilled in the art may make additional changes and modifications to these embodiments once basic creative concepts are known. Therefore, the appended claims are intended to be interpreted as including the preferred embodiment and all changes and modifications that fall within the scope of this application.

The technical features of the above-mentioned embodiments may be arbitrarily combined. In order to simplify the description, all possible combinations of the technical features in the above-mentioned embodiments are not described. The combination of these technical features should be considered to be within the scope of this application as long as there is no contradiction. Those skilled in the art may also make various changes and modifications to this application without departing from the spirit and scope of this application. Thus, in case that these modifications and variations of this application fall within the scope of the claims of this application and their technical equivalents, this application is also intended to include these modifications and variations without departing from the concept of this application. Therefore, the protection scope of this application should be determined by the claims

6

The invention claimed is:

1. An array substrate, comprising:
a thin film transistor (TFT) device layer;
a pixel definition layer arranged in a non-via area of a non-opening area of the TFT device layer, wherein the non-opening area comprises a via area and the non-via area;
a barrier wall arranged at the via area, wherein the barrier wall is in an inverted trapezoid shape;
an organic light emitting diode layer arranged on an upper end of the barrier wall and an upper end of part of auxiliary electrodes in the via area; and
a cathode arranged on the upper end of the part of the auxiliary electrodes in the via area;
wherein the TFT device layer comprises an auxiliary electrode, an anode and a thin film transistor structure; and
the thin film transistor structure is composed of a planarization layer, a source/drain, an insulation layer, a gate, a gate insulation layer, an active layer, a buffer layer, a light shielding layer and a substrate.

2. The array substrate according to claim 1, further comprising an inorganic thin film arranged below the pixel definition layer and the barrier wall.

3. The array substrate according to claim 2, wherein a first side etching space is formed between both sides of the barrier wall and edges of the inorganic thin film in the via area.

4. The array substrate according to claim 3, wherein a width of the first side etching space is 1 to 3 nanometers.

5. The array substrate according to claim 2, wherein a second side etching space is formed between the pixel definition layer and edges of the inorganic thin film in the non-via area.

6. The array substrate according to claim 5, wherein a width of the second side etching space is 1 to 3 nanometers.

7. The array substrate according to claim 2, wherein the inorganic thin film has a thickness in a range of 500 to 3000 angstroms.

8. The array substrate according to claim 2, wherein the inorganic thin film comprises a silicon dioxide thin film or a silicon nitride thin film.

9. The array substrate according to claim 1, wherein the organic light emitting diode layer is further arranged on an upper end of the pixel definition layer.

10. The array substrate according to claim 1, wherein the cathode is further arranged on an upper end of the organic light emitting diode layer.

11. The array substrate according to claim 1, wherein the organic light emitting diode layer is further arranged on an upper end of part of anodes in an opening area.

12. The array substrate according to claim 1, wherein the organic light emitting diode layer and the cathode are sequentially arranged on the upper end of the barrier wall.

13. A display panel comprising an array substrate, wherein the array substrate comprises:
a TFT device layer;
a pixel definition layer arranged in a non-via area of a non-opening area of the TFT device layer, wherein the non-opening area comprises a via area and the non-via area;
a barrier wall arranged at the via area, wherein the barrier wall is in an inverted trapezoid shape;
an organic light emitting diode layer arranged on an upper end of the barrier wall and an upper end of part of auxiliary electrodes in the via area; and
a cathode arranged on the upper end of the part of the auxiliary electrodes in the via area;

wherein the TFT device layer comprises an auxiliary electrode, an anode and a thin film transistor structure; and the thin film transistor structure is composed of a planarization layer, a source/drain, an insulation layer, a gate, a gate insulation layer, an active layer, a buffer layer, a light shielding layer and a substrate.

14. The display panel according to claim 13, further comprising an inorganic thin film arranged below the pixel definition layer and the barrier wall.

15. The display panel according to claim 14, wherein a first side etching space is formed between both sides of the barrier wall and edges of the inorganic thin film in the via area.

16. The display panel according to claim 15, wherein a width of the first side etching space is 1 to 3 nanometers.

17. The display panel according to claim 14, wherein a second side etching space is formed between the pixel definition layer and edges of the inorganic thin film in the non-via area.

18. The display panel according to claim 17, wherein a width of the second side etching space is 1 to 3 nanometers.

\* \* \* \* \*